United States Patent
Brelje et al.

(10) Patent No.: US 10,372,872 B2
(45) Date of Patent: Aug. 6, 2019

(54) PROVIDING EARLY WARNING AND ASSESSMENT OF VEHICLE DESIGN PROBLEMS WITH POTENTIAL OPERATIONAL IMPACT

(71) Applicant: The Boeing Company, Chicago, IL (US)

(72) Inventors: Benjamin J. Brelje, Seattle, WA (US); Kenneth D. Bouvier, Renton, WA (US)

(73) Assignee: THE BOEING COMPANY, Chicago, IL (US)

(*) Notice: Subject to any disclaimer, the term of this patent is extended or adjusted under 35 U.S.C. 154(b) by 519 days.

(21) Appl. No.: 15/136,170

(22) Filed: Apr. 22, 2016

(65) Prior Publication Data
US 2017/0308640 A1    Oct. 26, 2017

(51) Int. Cl.
G06F 17/50    (2006.01)
(52) U.S. Cl.
CPC ................. G06F 17/5086 (2013.01)
(58) Field of Classification Search
None
See application file for complete search history.

(56) References Cited

U.S. PATENT DOCUMENTS

| | | |
|---|---|---|
| 4,839,853 A | 6/1989 | Deerwester et al. |
| 2007/0083300 A1* | 4/2007 | Mukheriee |
| 2007/0083509 A1* | 4/2007 | Wu et al. |
| 2008/0249678 A1* | 10/2008 | Bailly et al. |
| 2015/0039551 A1* | 2/2015 | Huet et al. |

OTHER PUBLICATIONS

Wikipedia, "Latent semantic analysis", retrieved Feb. 18, 2016, 6 pages. <https://en.wikipedia.org/wiki/Latent_semantic_analysis>.

* cited by examiner

Primary Examiner — Syed A Roni
(74) Attorney, Agent, or Firm — Patterson + Sheridan, LLP

(57) ABSTRACT

Method and apparatus for unsupervised aircraft design. A plurality of design problem data and service event data for an aircraft is received from an electronic data repository. Embodiments communicate with sensors on the aircraft during flight operations and capturing service data and sensor data. A high order vector is generated for each received problem report and service event data and each high order vector is concatenated into a high order vector matrix. Embodiments generate a reduced order symptom-normalized matrix by factorization of the concatenated high order vector matrix and generate a similarity matrix from the symptom-normalized matrix. An impact score is computed for each in-service event data as a function of similar problem reports using the similarity matrix. Embodiments generate a priority matrix configured to identify service event data having high impact scores and communicate a real-time alert of the high impact scored service event.

19 Claims, 8 Drawing Sheets

PROVIDING EARLY WARNING AND ASSESSMENT OF VEHICLE DESIGN PROBLEMS WITH POTENTIAL OPERATIONAL IMPACT

BACKGROUND

Aspects described herein relate to vehicle design, and more specifically, to detecting design problems and determining an operational impact of the design problems on in-service vehicles.

Complex machinery, such as commercial aircraft, occasionally experience equipment faults. Some commercial aircraft and other complex machinery can transmit fault data to one or more computer systems, such as computer systems used by maintenance centers and computer systems operated by the aircraft manufacturer. Current aircraft design methodologies may include impromptu design reviews late in the design process and use engineering "tribunals" to determine the continued airworthiness of an aircraft design in a "post" detailed design setting. The decisions made by these reviews and tribunals may necessitate the rework of some designs, and delay completion of a finalized design. In addition, the follow-on continued airworthiness maintenance program analysis performed by maintenance engineers may be limited in its capability to revise non-optimized designs due to the late nature of the design stage in which this analysis is conducted. Such analysis may result in either design changes made late in the project or unwanted scheduled maintenance passed on to both an aircraft manufacturer and an aircraft operator that continues through the life of the aircraft. The current process may also result in scheduled maintenance tasks that require inspection for which tools and procedures do not presently exist.

For an airline, one major cost of operation is the time and labor required to keep an aircraft fleet in service. Thus, it is important for aircraft to have a design that is maintainable. As an aircraft design is being developed and/or modified, it would be desirable to evaluate the effects of aircraft design changes on maintenance time and labor. Currently available tools, however, lack sufficient flexibility and agility needed to track such parameters from preliminary design to firm configuration. Moreover, a vehicle, such as an aircraft, construction equipment, or an automobile, may periodically be taken out of service for the performance of scheduled maintenance on the apparatus. Maintenance is performed to ensure that all component parts are operating at peak efficiency and with optimal safety. Different maintenance tasks may need to be performed at different intervals than other maintenance tasks. For example, in an automobile, air filters may need to be checked and replaced more frequently than the tires or the timing belt. Therefore, different maintenance tasks are typically scheduled to occur at different intervals.

Engineers use design information and engineering knowledge, judgment, and manual engineering analysis to determine how frequently different maintenance tasks should be scheduled. For example, as part of instructions for continued airworthiness (ICA) requirements, aircraft engineers develop an initial scheduled maintenance program, also known as maintenance review board report (MRBR) or maintenance planning document (MPD). Current practice relies on aircraft engineering judgments and prudence dictates higher conservatism in scheduling frequency of maintenance. Manual engineering analysis is typically performed using data from a limited number of operators to identify the appropriate frequency and scheduling of these maintenance tasks. Subsequent optimization of scheduled maintenance tasks is performed based on scheduled maintenance data gathered by participating operators during regular, out-of-service, scheduled maintenance. In addition, the scheduled maintenance data is not submitted in a consistent format and the submission of the scheduled maintenance data is also voluntary. In other words, subsequent optimization of maintenance tasks is determined based on scheduled maintenance data, which is largely limited to hangar maintenance findings.

Additionally, not all issues can be resolved through regular maintenance, and occasionally problems with occur with in-service vehicles and can interrupt the service. For example, a problem with an aircraft detected during a pre-flight inspection can result in the flight being delayed until the problem can be resolved or cancelled if the problem cannot be resolved in a sufficient period of time. This, in turn, can result in increased cost for the aircraft operator (e.g, an airline), as the aircraft operator may Incur costs for inconveniencing; its customers (e.g., accommodating the customers on another flight, obtaining overnight accommodations for the customers, etc.) and penalty fees e.g., assessed by an airport for cancelling the flight), in addition to the fees for repairing the aircraft.

SUMMARY

According to one embodiment of the present invention, an unsupervised machine learning aircraft design method includes receiving, by operation of at least one processor coupled to an electronic data repository and a communication network, a plurality of design problem data and in-service event data for an aircraft from the electronic data repository, where the plurality of design problem data and in-service event data includes heterogeneous natural language data, free text data, numeric data, and scalar and vector sensor data. The method includes generating a high order vector for each of the plurality of design problem data and in-service event data. The method further includes concatenating each high order vector into a high order vector matrix. Additionally, the method includes generating a reduced order symptom-normalized matrix by dimensionality reduction of the high order vector matrix. The method also includes generating a similarity matrix from the reduced order symptom-normalized matrix by computing a similarity metric between the reduced order symptom-normalized matrix and each of the plurality of problem data and in-service event data. The method includes computing an impact score for each design problem represented in the similarity matrix as a function of a corresponding portion of the plurality of design problem data and in-service event data. Also, the method includes generating a priority matrix configured to identify design problems having high impact scores and communicating an alert of the high impact scored design problems.

In one aspect, in combination with any example above, the service event data includes one or more of in-service event fault codes and sensor data.

In one aspect, in combination with any example above, the method further comprises prioritizing corresponding maintenance schedule and design updates for at least one aircraft during development, based on the similarity matrix.

In one aspect, in combination with any example above, wherein computing the impact score for each design problem is based on analyzing a database of event reports comprising maintenance or other operational consequences including historical dispatch delays, maintenance time and maintenance cost associated with a plurality of historical in in-service problem reports on vehicles, to determine a respective cost value.

In one aspect, in combination with any example above, the method further includes prioritizing a plurality of design updates on at least one aircraft during development, based on the generated similarity matrix, in order to minimize an overall severity of the maintenance or other operational consequences for a delivered vehicle.

In one aspect, in combination with any example above, receiving the plurality of design problem data and service event data for the aircraft from the electronic data repository further includes data mining a database comprising a plurality of lab tests problem reports, a plurality of vehicle test problem reports, a plurality of vehicle system health management fault reports, and a plurality of vehicle sensor inputs.

In one aspect, in combination with any example above, the method further includes providing a plurality of predefined trigger conditions, each specifying conditional logic for one or more types of sensor data collected from the sensors on the aircraft, and, upon determining that one or more sensor data values from the sensors on the aircraft satisfy one of plurality of predefined trigger conditions, recording a sensor event in the plurality of design problem data and in-service event data.

In one aspect, in combination with any example above, in-service events in the in-service event data are automatically recorded by control logic within the aircraft.

In one aspect, in combination with any example above generating the high order vector for each of the plurality of design problem report and in-service event data, further includes performing a vector space analysis of the plurality of design problem data and in-service event data, such that a respective vectorial representation is calculated based on the heterogeneous natural language data, free text data, numeric data, and scalar and vector sensor data.

In one aspect, in combination with any example above, generating the reduced order symptom-normalized matrix by dimensionality reduction of the high order vector matrix further includes performing a truncated singular value decomposition factorization of the high order vector matrix, wherein the reduced order symptom-normalized matrix approximates the high order vector matrix.

In one aspect, in combination with any example above, computing the similarity metric between the reduced order symptom-normalized matrix and each of the plurality of problem report and service event data further includes calculating a measure of similarity between each vectorial representation within the reduced order symptom-normalized matrix.

In one aspect, in combination with any example above, the method further includes performing a clustering algorithm on a plurality of vectors within the reduced order symptom-normalized matrix.

In one aspect, in combination with any example above, computing the impact score for each design problem is further based on an operational impact estimation algorithm.

In one aspect, in combination with any example above, the operational impact estimation algorithm includes a measure of delay time, a measure of repair cost, and a measure of whether a flight was cancelled.

Another embodiment provides a system that includes one or more computer processors and a memory containing computer program code that, when executed by operation of the one or more computer processors, performs an operation. The operation includes retrieving problem report data for at least a first class of vehicle, which includes retrieving a plurality of user-submitted problem reports, each comprising a natural language description of a respective problem occurrence, retrieving a plurality of service events, each specifying a fault code, and retrieving a plurality of sensor events, each corresponding to a respective occurrence of a pattern of data being received from one or more sensor devices. Additionally, the operation includes calculating a vector representation for each of the plurality of user-submitted problem reports, the plurality of service events and the plurality of sensor events. The operation further includes reducing a dimensionality of the vector representations and calculating similarity values between the vector representations. The operation includes categorizing each of the vector representations into one of a plurality of problem categories, based on the similarities, and determining a respective impact for each of the plurality of problem categories.

In one aspect, in combination with any example above, the operation further comprises providing a plurality of predefined trigger conditions, each specifying conditional logic for one or more types of sensor data collected from the one or more sensor devices, and upon determining that one or more sensor data values from the one or more sensor devices satisfy one of plurality of predefined trigger conditions, recording one of the plurality of sensor events.

In one aspect, in combination with any example above, calculating the vector representation for each of the plurality of user-submitted problem reports, the plurality of service events and the plurality of sensor events, comprises performing a latent semantic analysis of the problem report data, such that a respective vectorial representation is calculated for each of a plurality of problem reports of the problem report data, based on a corresponding portion of the plurality of user-submitted problem reports, the plurality of service events and the plurality of sensor events, and generating a matrix that includes all of the vectorial representations for the plurality of user-submitted problem reports, the plurality of service events and the plurality of sensor events.

In one aspect, in combination with any example above, reducing the dimensionality of the calculated vector representations further comprises performing a truncated singular value decomposition factorization of the matrix, to generate a reduced matrix, wherein reduced matrix approximates the matrix.

In one aspect, in combination with any example above wherein calculating the similarity values between the vector representations further comprises calculating a respective similarity metric between each vectorial representation within the reduced matrix and each other vectorial representation within the reduced matrix, and wherein categorizing each of the vector representations within the reduced matrix into one of a plurality of problem categories further comprises performing a clustering algorithm on the similarity metrics between each vectorial representation within the reduced matrix.

Yet another embodiment provides a non-transitory computer-readable medium containing computer program code that, when executed by operation of one or more computer processors, performs an operation. The operation includes retrieving problem report data for at least a first class of vehicle, which includes retrieving a plurality of user-submitted problem reports, each comprising a natural language description of a respective problem occurrence, retrieving a plurality of service events, each specifying a fault code, and retrieving a plurality of sensor events, each corresponding to a respective occurrence of a pattern of data being received from one or more sensor devices. The operation also includes calculating a vector representation for each of the plurality of user-submitted problem reports, the plurality of service events and the plurality of sensor events. Additionally, the operation includes reducing a dimensionality of the calculated vector representations and calculating similarity values between the reduced vector representations. The operation further includes categorizing each of the reduced vector representations into one of a plurality of problem categories, based on the calculated similarities and determining a respective impact for each of the plurality of problem categories.

BRIEF DESCRIPTION OF ILLUSTRATIONS

DETAILED DESCRIPTION

Figure 1:
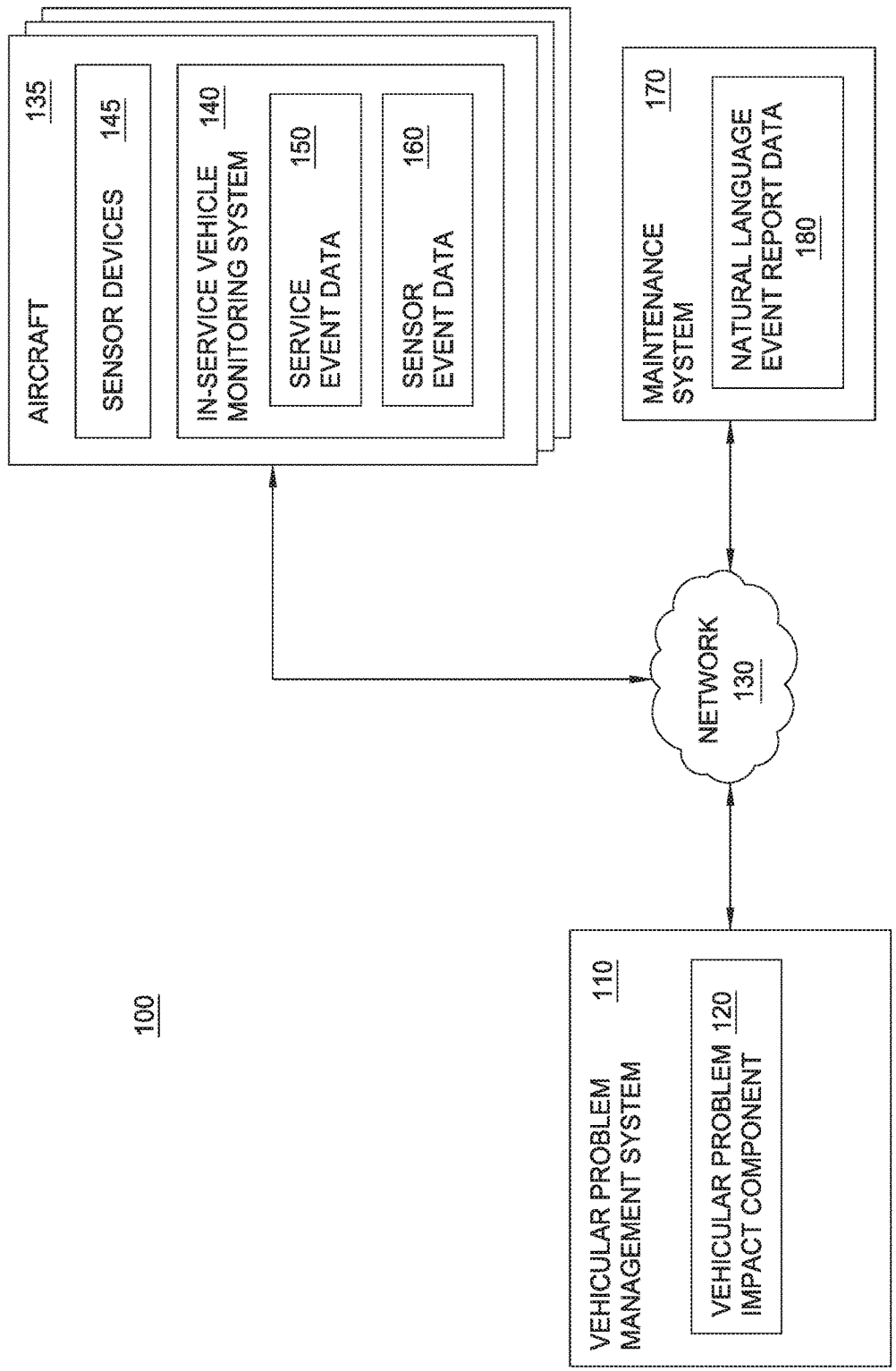
FIG. 1 is a block diagram illustrating a system configured with a vehicular problem impact component, according to one embodiment described herein.

Over time, vehicle systems (such as commercial airplanes) have increased in complexity and development cost. Problems identified in a system or subsystem during development may affect many other systems in complex interdependencies. Due to global supply chains and partnering arrangements, problems created by a supplier may not be tested or uncovered until integrated with other components and subsystems at a later time. When these problems are not identified and fixed at the source, the cost to accomplish the change can increase significantly. Moreover, these problems can further result in lower than expected entry-into-service reliability and can create customer dissatisfaction.

Design and implementation errors in complex system development programs can generate problem during the test and evaluation phase (e.g., error messages and failed test conditions). These problems can be recorded as problem reports (PRs), which are tracked and managed in a dedicated database. PRs may be associated with various data, which may range from thousands of channels of digital telemetry to a few lines of unstructured free text. In developing new vehicles, engineering leaders need to know which problem reports constitute the most significant problems (i.e., problems which could cause impact in-service performance in the future), so that engineering effort can be allocated toward fixing these problems. Furthermore, individual engineers often lack insight into the impact of their design choices on customers when a product enters service.

Currently, at best, engineers can apply their personal judgment as to which in-service problem reports constitute the most significant vehicle issues and which are not significant issues (e.g., a problem with a test rig, problem reports generated under improper test conditions, problems caused by one-off manufacturing issues, and so on). Such current techniques can produce deeply flawed results, due to their failure to find and fix reliability issues prior to entry into service. For instance, the sheer volume of problem reports generated at the height of a development program can be overwhelming for engineers to review manually. During ground and flight test, hundreds of problem reports might be generated each day, accumulating to tens of thousands over the course of a program, a number that quickly becomes unmanageable for a human performing the task of manual PR assessment. For example, in order to assess whether a PR constitutes a recurring issue, an engineer would need to compare each new PR against all of the tens of thousands of preceding PRs. Given the urgency to fix problems quickly, such manual techniques are simply not feasible.

Furthermore, a system integrator (e.g., an aircraft designer and manufacturer) often relies on parts and systems designed by suppliers. In such a situation, the system integrator may not have personnel with experience in a particular system and its operation, meaning that the system integrator does not have personnel who can offer an engineering judgment as to the severity of a problem with that particular system. As a result, the system integrator may be unable to identify certain problems in vehicle designs until the design is nearly complete and the problem is revealed through testing.

As such, embodiments generally provide techniques for identifying high-impact design problems during in a vehicle's development process. Before a vehicle enters service, it is difficult to determine if design problems (often revealed by abnormal tests) represent true threats to its operational performance. Embodiments described herein can associate design problems from a new vehicle with in-service data from existing vehicles, including the severity of an operational impact to operational performance so that a quantifiable, early warning may be provided to the designers of the vehicle. Designers may then focus efforts on fixing the highest-impact problems for maximum vehicle performance at entry-into-service. As such, embodiments can reduce the cost of product development and can improve entry into service reliability for new vehicles.

More specifically, embodiments can transform signals associated with vehicle design problems into a quantified estimate of potential operational impact, as well as a process for accomplishing the transformation. The most significant novel feature of the invention is mathematically transforming signals and data associated with problem reports from a new vehicle into a reduced-order vector space over the entire service experience of existing vehicles. In the reduced order space, each row in the vectorial representation (also referred to herein as a "feature") conceptually represents a "symptom" of a technical problem, and problem reports can be associated with in-service events by identifying similar sets of "symptoms." These symptoms may be determined by considering the entire service experience of a vehicle/vehicle(s), effectively mining patterns and trends that humans cannot spot. Embodiments described herein combine features from free text with features derived from sensor or other data sets, and treat vectors in the reduced order space as corresponding to symptoms of technical issues, such that events with similar symptoms may be found. Additionally, embodiments can use service experience datasets from existing vehicles as a numerical input to a metric estimating impact of design flaws in a new vehicle, and can generate a risk score for a vehicle event indicative of a design problem.

FIG. 1 is a block diagram illustrating a system configured with a vehicular problem impact component, according to one embodiment described herein. As shown, the system 100 includes a vehicular problem management system 110, a plurality of aircraft 135 and a maintenance system 170, interconnected via a network 130. The vehicular problem management system 110 includes a vehicular problem impact component 120. Each aircraft 135 includes sensor devices 145 and an in-service vehicle monitoring system 140, which in turn includes service event data 150 and sensor event data 160. Generally, the service event data 150 represents diagnostic data (e.g., diagnostics codes and corresponding timestamps at which events classified with the diagnostic codes were detected) collected for the corresponding in-service vehicle. In one embodiment, events within the service event data 150 are automatically recorded by control logic within vehicles of the given class of vehicle.

The sensor event data 160 generally represents data collected from the sensor devices 145 on the respective in-service vehicle. Sensor devices 145 may include, without limitation, temperature sensors, pressure sensors, positioning sensors, altitude sensors, and so on. More generally, any sensor suitable for monitoring an attribute of an in-service vehicle can be used, consistent with the functionality described herein. In one embodiment, the vehicular problem management system 110 provides a plurality of predefined trigger conditions, each specifying conditional logic for one or more types of sensor data collected from the one or more sensor devices. In such an embodiment, upon determining that one or more sensor data values from the one or more sensor devices satisfy one of plurality of predefined trigger conditions, the vehicular problem management system 110 records a sensor event within the sensor event data 160.

The maintenance system 170 generally represents a computer system through which maintenance event reports can be submitted (e.g., by engineers) and includes natural language event report data 180. Generally, the natural language event report data 180 includes a natural language description of each of a plurality of service events. For example, an engineer could enter (e.g., using a graphical user interface generated by the maintenance system 170) a textual description of a particular service event, including, for example, the problem experienced, the cause of the problem, the impact(s) of the service event and the resolution of the problem.

Generally, the vehicular problem impact component 120 is configured to analyze event data for a given type of vehicle and to determine an operational impact of each type of service event. According to one embodiment, the vehicular problem impact component 120 receives a plurality of design problem and service event data for an aircraft from an electronic data repository. For example, the vehicular problem impact component 120 could receive the service event data 150, sensor event data 160 and natural language event report data 180 over the network 130. Additionally, the vehicular problem impact component 120 can communicate with the in-service vehicle monitoring systems 140 on the plurality of aircraft 135, during flight operations, to capture and store in the service event data, the scalar and vector sensor data from sensors on each of the respective in-service vehicles.

Upon collecting the design problem and in-service event data, the vehicular problem impact component 120 can generate a high order vector for each of the received problem report and service event data. The vehicular problem impact component 120 can then concatenate each high order vector into a high order vector matrix. Once the high order vector matrix is created, the vehicular problem impact component 120 can generate a reduced order symptom-normalized matrix by performing a dimensionality reduction of the concatenated high order vector matrix. For example, the vehicular problem impact component 120 could apply a singular value decomposition (SVD) algorithm (e.g., a truncated singular value decomposition algorithm) to the high order vector matrix in order to reduce the dimensionality of the high order vector matrix. In other embodiments, the dimensionality reduction is performed using principal component analysis (PCA) and/or triangular matrix decomposition techniques. More generally, any technique for reducing the dimensionality of a matrix may be used, consistent with the functionality described herein. Doing so reduces the order of the problem of determining similar groups of values and vectors within the matrix.

The vehicular problem impact component 120 can then analyze the values and vectors within the reduced dimensionality matrix in order to determine similar groups of values and vectors within the matrix. For example, the vehicular problem impact component 120 could generate a similarity matrix from the symptom-normalized matrix by computing a similarity metric between the symptom-normalized matrix and each of the problem report and service event data. Doing so enables the vehicular problem impact component 120 to group the various service events into groups of similar service events.

The vehicular problem impact component 120 could then determine an operation impact of each grouping of similar service events. For example, the vehicular problem impact component 120 could compute an impact score for each service event data as a function of similar problem reports using the similarity matrix. The vehicular problem impact component 120 could further generate a priority matrix configured to identify service event data having high impact scores and could communicate a real-time alert of the high impact scored service event. Doing so provides an indication of the most significant problems (e.g., problems determined to have the greatest operational impact on in-service vehicles), which can enable engineers to prioritize the resolution of these problems during the design phase of new vehicles.

Figure 2:
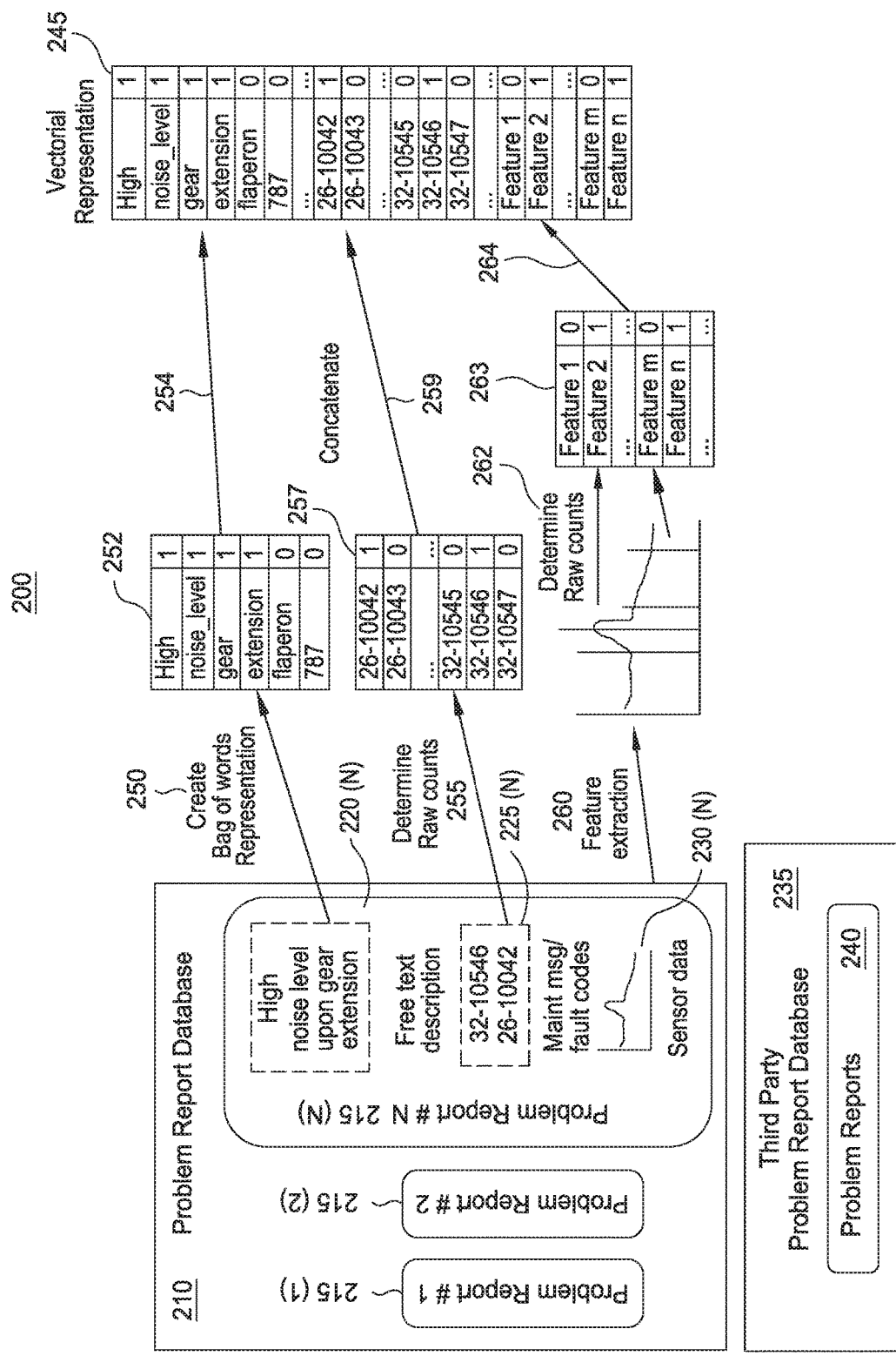
FIG. 2 is diagram illustrating a method of generating a vectorial representation of a problem report, according to one embodiment described herein.

FIG. 2 is diagram illustrating a method of generating a vectorial representation of a problem report, according to one embodiment described herein. As shown, the diagram 200 includes a problem report database 210 and a third party problem report database 235. The problem report database 210 includes problem reports 215(1)-215(N). Likewise, the third party problem report database 235 includes problem reports 240. Generally, each of the problem reports 215(1)-(N) and problem reports 240 represents a report of a problem occurring with an in-service vehicle. As shown in problem report 215(N), each problem report 215 includes a free text problem report 220(N), one or more service event maintenance messages/fault codes 225(N) and sensor data 230(N). The free text problem report 220(N) generally represents a natural language description of the corresponding problem (e.g., submitted by a technician). The sensor data 230(N)

represents sensor device readings collected during a temporal range corresponding to the problem report. For example, the sensor data 230(N) could include readings from a plurality of sensors during a period of time ranging from a predetermined amount of time before and after the problem was detected. The one or more service event maintenance messages/fault codes 225(N) generally include one or more codes or maintenance messages generated within a range of time surrounding the detected problem.

The vehicular problem impact component 120 can perform a latent semantic analysis of the free text problem report 220(N) in order to generate a bag of words matrix representation 252 (operation 250). Such an analysis can include a number of different operations, including tokenization, bigram collocation, preprocessing and so on, and such an analysis is discussed in further detail below. The vehicular problem impact component 120 can further analyze the maintenance message/fault codes 225(N) in order to determine a matrix 257 representing a raw count of each respective maintenance message/fault codes (operation 255). In the present example, the matrix 257 illustrates that the fault codes "26-10042" and "32-10546" were detected during the problem occurrence corresponding to the problem report 215(N). The vehicular problem impact component 120 can perform a feature extraction analysis on the sensor data 230(N) in order to determine a vector representing a raw count of each feature (or pattern) of sensor data was detected during the problem occurrence corresponding to the problem report 215(N). Generally, each feature represents a recognized pattern of sensor data for a given sensor(s). Thus, in the present example, the matrix 263 indicates that "Feature 2" and "Feature n" were detected within the sensor data collected during the corresponding problem occurrence.

The vehicular problem impact component 120 then performs a concatenation operation on the matrices (i.e., bag of words matrix representation 252, matrix 257 and matrix 263) to produce the vectorial representation 245 for the problem report 215(N). Advantageously, the vectorial representation 245 for the problem report 215(N) includes a vectorial representation for not only the free text problem report 220(N) (e.g., a natural language problem report) but also for the maintenance message/fault codes 225(N) and sensor data 230(N), thereby enabling the vehicular problem impact component 120 to more accurately represent the problem reports 215. Of note, while only a single third party problem report database 235 (e.g., a supplier database) is shown in the diagram 200, more generally any number of databases containing problem reports can be used, consistent with the functionality described herein.

Figure 3:
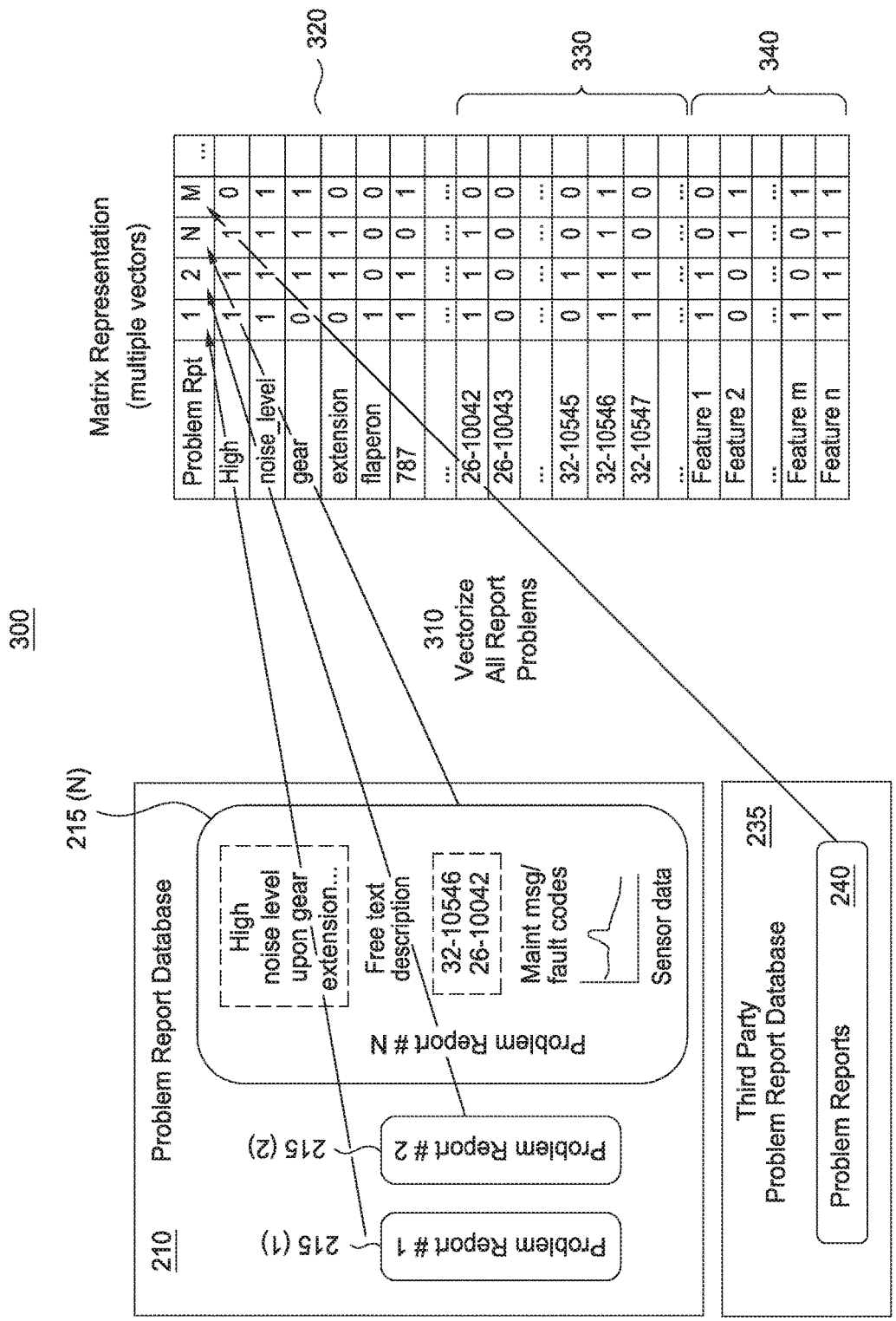
FIG. 3 is a diagram illustrating a method of generating a matrix from vectorial representations of problem reports, according to one embodiment described herein.

The vehicular problem impact component 120 can continue, generating vectorial representations for each of the other problem reports 215(1)-215(N) within the problem report database 210, as well as the problem reports 240 in the third party problem report database 235. The vehicular problem impact component 120 can then consolidate all of the vectorial representations into a matrix. FIG. 3 is a diagram illustrating a method of generating a matrix from vectorial representations of problem reports, according to one embodiment described herein. As shown, the diagram 300 includes the problem report database 210 and third party problem report database 235, including problem reports 215(1)-(N) and problem reports 240, respectively.

The vehicular problem impact component 120 can vectorize all of the problem reports 215(1)-(N) and 240 (e.g., as shown in diagram 200), as shown in operation 310. The vehicular problem impact component 120 can then concatenate all of the resulting vectors in order to create the matrix 320). As shown, the matrix 320 includes a vectorization of the maintenance messages/fault codes and sensor data, for each of the problem reports, with the values 330 representing maintenance messages/fault codes for each of the problem reports and the value 340 representing the detected features of sensor data within each of the problem reports.

Figure 4:
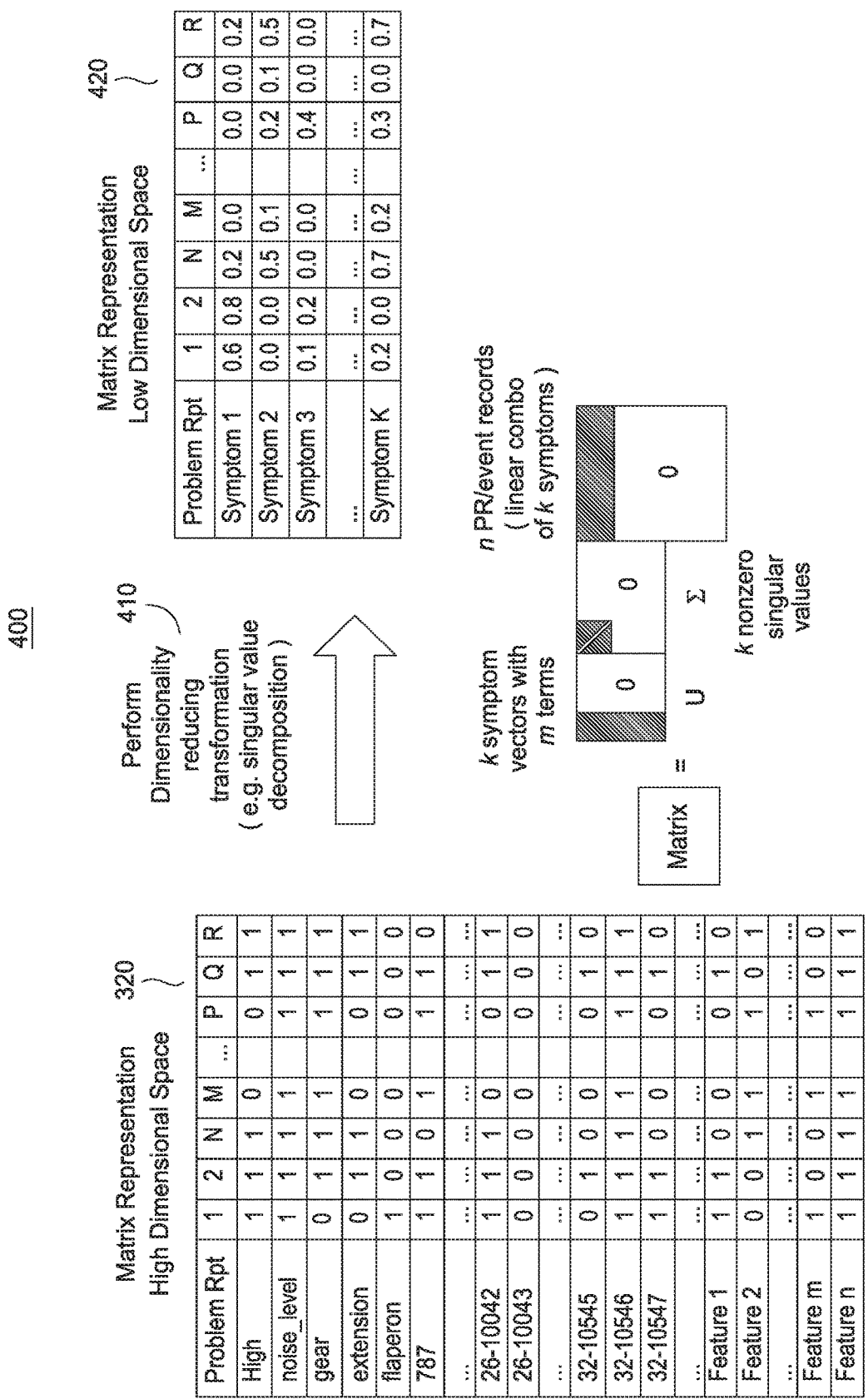
FIG. 4 is a diagram illustrating a method of reducing the dimensionality of a matrix generated from vectorial representations of problem reports, according to one embodiment described herein.

When dealing with a substantial number of problem reports, the raw matrix resulting from the concatenation of the problem report vectors can be cumbersome to work with, due to the sheer size of the matrix. As such, the vehicular problem impact component 120 can reduce the dimensionality of the resulting matrix (e.g., using a singular value decomposition operation). Doing so reduces the amount of time needed to analyze the matrix. FIG. 4 is a diagram illustrating a method of reducing the dimensionality of a matrix generated from vectorial representations of problem reports, according to one embodiment described herein. As shown, the diagram 400 includes the matrix 320 generated by concatenating all of the vectorial representations of the problem reports. The vehicular problem impact component 120 performs a dimensionality reducing transformation (e.g., truncated singular value decomposition) of the matrix 320 in order to generate the lower dimensional space matrix 420. Advantageously, by reducing the dimensionality of the matrix 320, the vehicular problem impact component 120 can determine patterns of symptoms (e.g., words, fault codes, etc.) which are related and ought to be considered "synonyms" for purposes of identifying design problems.

The vehicular problem impact component 120 could then generate a similarity matrix from the lower dimensional space matrix 420 by computing a similarity metric between the lower dimensionality matrix 420 and each of the problem reports. The vehicular problem impact component 120 could further compute an impact score for each problem report as a function of similar problem reports using the similarity matrix. The vehicular problem impact component 120 could then communicate a real-time alert of the high impact scored service event. For example, the vehicular problem impact component 120 could detect that a particular problem, when it occurs, has a particularly high operational impact for an aircraft. As a result, steps could be taken to mitigate the operational impact (e.g., ordering parts so that the needed maintenance components are available when the problem occurs, scheduling preventative maintenance to prevent the problem from occurring, etc.).

Figure 5:
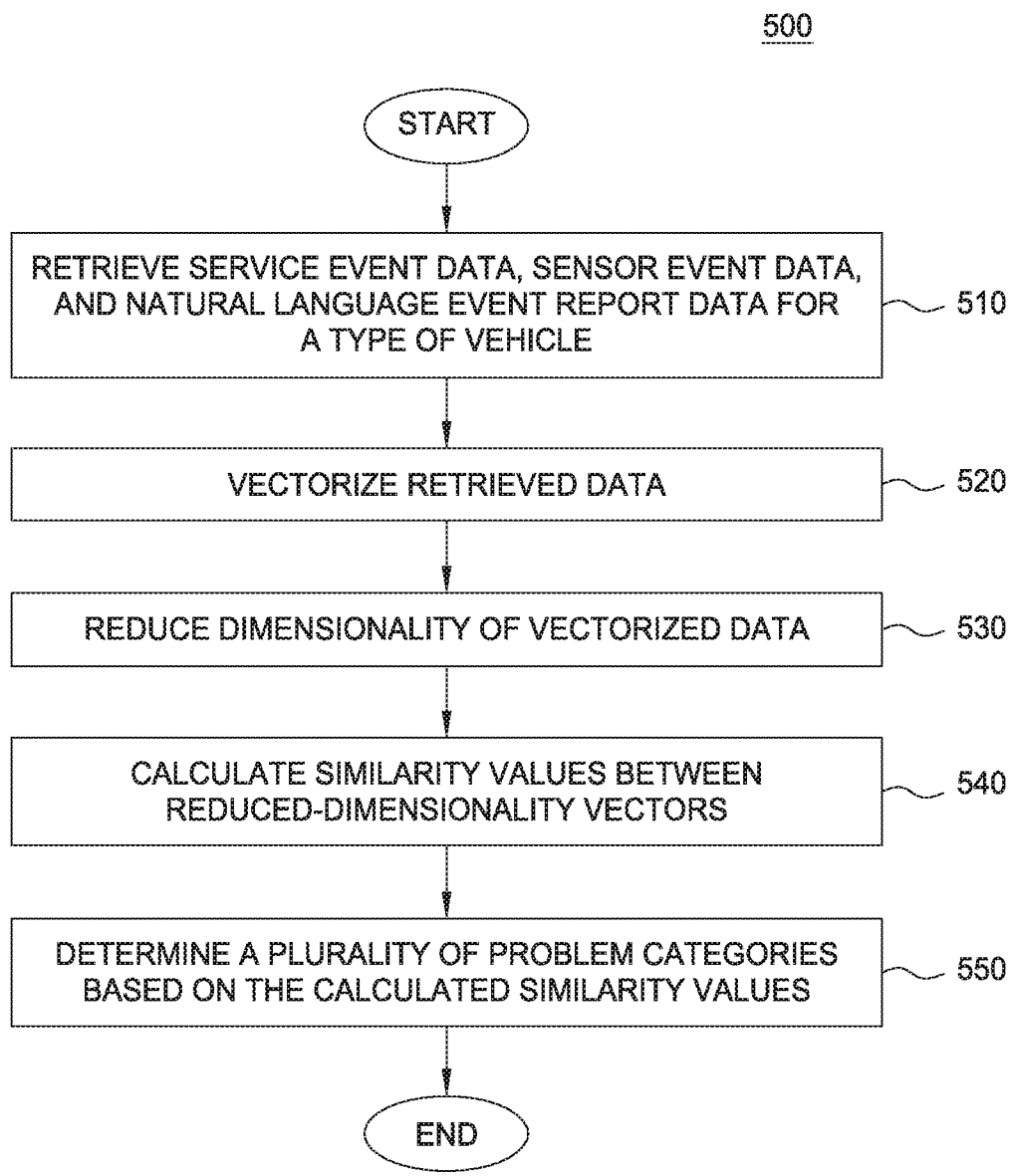
FIG. 5 is a flow diagram illustrating a method of determining a plurality of problem categories for a set of in-service vehicle events, according to one embodiment described herein.

FIG. 5 is a flow diagram illustrating a method of determining a plurality of problem categories for a set of in-service vehicle events, according to one embodiment described herein. As shown, the method begins at block 510, where the vehicular problem impact component 120 retrieves service event data, sensor event data and natural language event data for a type of vehicle. For example, the vehicular problem impact component 120 could retrieve service data for a particular model of aircraft from when the particular model of aircraft was in service. In one embodiment, the vehicular problem impact component 120 retrieves the data by data mining a database comprising a plurality of lab tests problem reports, a plurality of vehicle test problem reports, a plurality of vehicle system health management fault reports, and a plurality of vehicle sensor inputs.

The vehicular problem impact component 120 then vectorizes the retrieved data (block 520). For instance, the vehicular problem impact component 120 could generate a vectorial representation for each of a plurality of problem reports, where the generated vector includes a vectorization of the service event data, sensor event data and natural language event data corresponding to the respective problem report. For instance, a given problem report could include a natural language description of the problem (e.g., submitted by a technician), maintenance messages/fault codes generated by control logic on the vehicle around the time the problem occurred (e.g., within a predefined window of time surrounding the time the problem occurred), and sensor values detected around the time the problem occurred by a plurality of sensor devices on the aircraft.

In generating the vectorial representations of the problem reports, the vehicular problem impact component 120 could perform a latent semantic analysis (LSA) of the natural language event data to generate a vectorial representation of each distinct service event described within the natural language event data. Generally, LSA is a natural language processing technique for analyzing relationships between a set of documents and terms contained within the documents, in order to generate a set of concepts related to the documents and the terms. As a general matter, LSA assumes that words that are close in meaning will occur in similar pieces of text.

Generally, LSA can employ a processing pipeline that includes 1) tokenization, 2) bigram collocation, 3) preprocessing (e.g., stopwords, document frequencies, etc.), 4) vectorization and term frequency—inverse document frequency, 5) reducing dimensionality of the generated matrix and finally 6) computing document similarity. During tokenization, the vehicular problem impact component 120 could break the raw text of the document into a series of "tokens." In one embodiment, the vehicular problem impact component 120 is configured to "stem" the tokens (i.e., removing verb or plural word endings). For example, for the word "repaired," the vehicular problem impact component 120 could remove the ending "ed" resulting in the base word "repair."

During bigram collocation, the vehicular problem impact component 120 could identify certain combinations of words within the documents that have a distinct meaning when they appear together (e.g., the word "change" alone vs. the combination "change request"). In one embodiment, the vehicular problem impact component 120 is configured to use the Equation 1, shown below, to identify phrases within the documents.

Phrase Identification  Equation 1

$$score(w_i, w_j) = \frac{count(w_i w_j) - \delta}{count(w_i) \times count(w_j)}.$$

Here, δ represents a discounting coefficient designed to prevent the detection of phrases made from very infrequent words. The vehicular problem impact component 120 could calculate scores using the Equation 1 for each combination of adjacent words within a given document and could then select the phrases having a calculated score above a predefined threshold as the recognized phrases having a distinctive meaning apart from the meanings of the respective words within the phrase.

In the preprocessing stage, the vehicular problem impact component 120 could remove stopwords (i.e., common or generally meaningless words, such as "the," "an," and so on). In one embodiment, the vehicular problem impact component 120 is configured to remove words that appear too frequently or too infrequently within the documents. For example, the vehicular problem impact component 120 could determine a document frequency for a given word by determining a number of documents in which the word appears across the entire corpus, and could exclude words whose document frequency exceeds a maximum threshold level of frequency and words whose document frequency is less than a minimum threshold level of frequency.

During the vectorization stage, the vehicular problem impact component 120 could convert each document into a "bag of words" vectorial representation. For example, the vehicular problem impact component 120 could generate a matrix row for each term in the entire corpus and could generate a column for each document in the corpus. The vehicular problem impact component 120 could then determine a value for each cell in the matrix, by calculating the number of times the corresponding term appears within the corresponding document. Additionally, the vehicular problem impact component 120 could calculate a vectorization and term frequency—inverse document frequency value for each cell within the matrix. That is, the vehicular problem impact component 120 can prioritize terms which distinguish documents from one another. For example, the vehicular problem impact component 120 could determine that relatively rare words are more characteristic than more common words, and could add a weighting term with inverse document frequency. For example, the vehicular problem impact component 120 could use the Equation 2 shown below in prioritizing the terms, where A(i, j) represents the term frequency of term i in document j, N is the total number of documents in the corpus, and df(i) is the document frequency of term i.

Term Frequency-Inverse Document Frequency  Equation 2

$$Tfldf(i, j) = A(i, j) * \log\left(\frac{N}{df(i)}\right)$$

Additionally, the vehicular problem impact component 120 could generate a vectorial representation of the sensor data corresponding to the problem report. For example, the vehicular problem impact component 120 could analyze the sensor data to determine one or more recognized patterns occurring within the sensor data. The vehicular problem impact component 120 could then generate a vectorial representation of the determined one or more patterns. The vehicular problem impact component 120 could also generate a vectorial representation of the maintenance / fault codes corresponding to the problem report. Thus, the vehicular problem impact component 120 can generate a vector for each problem report based on the vectorial representation of the natural language problem report, the vectorial representation of the sensor data and the vectorial representation of the maintenance / fault codes.

The vehicular problem impact component 120 reduces the dimensionality of the resulting matrix (block 530). In doing so, the vehicular problem impact component 120 generates a reduced dimensionality matrix that approximates the matrix resulting from the concatenation of the vectorized problem reports. In one embodiment, the vehicular problem impact component 120 is configured to employ SVD in order to reduce the dimensionality of the matrix. In doing so, the vehicular problem impact component 120 can retain only the top k concept vectors and the m terms within the matrix.

The vehicular problem impact component 120 then computes a similarity between the various reduced-dimensionality vectors in the corpus (block 540). For example, for each document vector in the reduced dimensionality matrix, the vehicular problem impact component 120 could calculate a similarity value between the document vector and each other document vector in the reduced dimensionality matrix (e.g., using cosine similarity). More generally, however, any suitable technique for calculating a measure of similarity between vectors can be used, consistent with the functionality described herein.

Once the similarity values are calculated, the vehicular problem impact component 120 determines a plurality of problem categories based on the calculated similarity values (block 550), and the method 500 ends. That is, the vehicular problem impact component 120 could employ a clustering algorithm to determine a plurality of clusters of reduced-dimensionality vectors, such that the vectors within each of the clusters are more similar to each other than the vectors within other clusters. For example, the vehicular problem impact component 120 could utilize k-means clustering to generate the groups of similar vectors. More generally, any clustering algorithm suitable for generating groups of similar vectors can be used, consistent with the functionality described herein.

Figure 6:
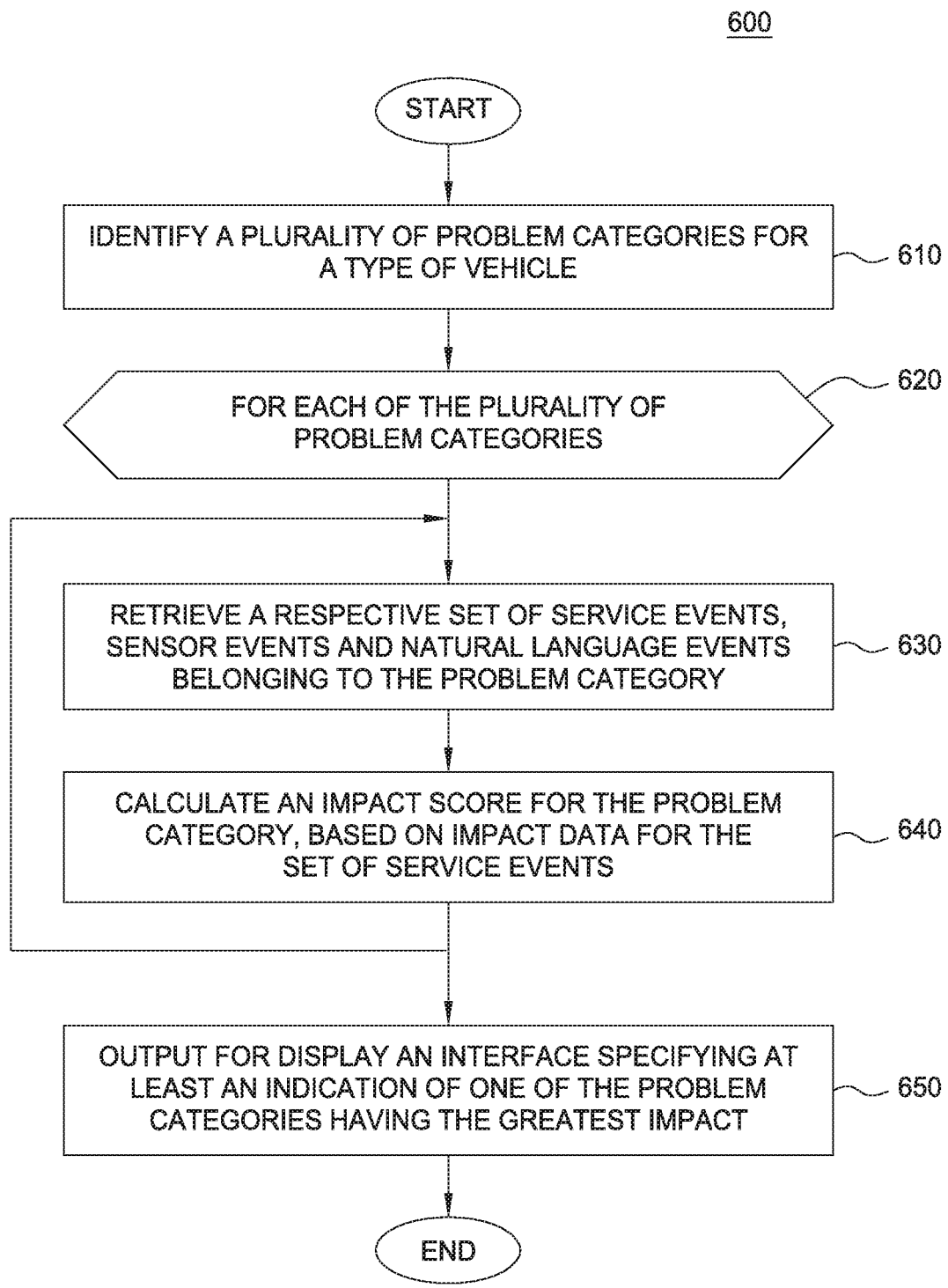
FIG. 6 is a flow diagram illustrating a method for displaying an indication of a problem category having a greatest impact, according to one embodiment described herein.

FIG. 6 is a flow diagram illustrating a method for displaying an indication of a problem category having a greatest impact, according to one embodiment described herein. As shown, the method 600 begins at block 610, where the vehicular problem impact component 120 identifies a plurality of problem categories for a given type of vehicle. For example, the vehicular problem impact component 120 could utilize the method 500 shown in FIG. 5 and described above to identify the plurality of problem categories.

The method 600 then enters a loop, where for each of the plurality of problem categories (block 620), the vehicular problem impact component 120 retrieves a respective set of service events, sensor events and natural language events belonging to the given problem category (block 630). That is, the vehicular problem impact component 120 could retrieve the service events and their corresponding data whose vectorial representation was assigned to the cluster corresponding to the respective problem category. The vehicular problem impact component 120 then calculates an impact score for the problem category, based on impact data for the retrieved set of service events (block 640). The method 600 then returns to block 630, where the vehicular problem impact component 120 retrieves another set of service events, sensor events and natural language events for the next problem category.

Generally, the impact score represents a quantification of the operational impact of service events belonging to the respective problem category. For example, the vehicular problem impact component 120 could calculate the impact scores based on analyzing a database of event reports comprising maintenance or other operational consequences including historical dispatch delays, maintenance time and maintenance cost associated with a plurality of historical in service problem reports on vehicles, to determine a respective cost value for each of the plurality of problem categories. In one embodiment, the vehicular problem impact component 120 calculates the impact score based on a measure of delay caused by the occurrence of the service event, a monetary repair cost to remedy the service event, a determination as to whether the occurrence of the service event resulted in a cancelled flight, and a determination as to whether the occurrence of the service event resulted in a monetary penalty for the vehicle operator. In such an embodiment, the vehicular problem impact component 120 can be configured to apply a respective weight to each of the considered factors in calculating the impact score. However, such an example is provided without limitation and for illustrative purposes only, and more generally, any algorithm for quantifying the operational impact of service events belonging to the respective problem category can be used, consistent with the present disclosure.

Once the impact scores have been calculated for all of the problem categories in the plurality of problem categories, the vehicular problem impact component 120 outputs for display an interface specifying at least an indication of one of the problem categories having the greatest operational impact (block 650), and the method 600 ends. Advantageously, doing so enables engineers to determine which categories of service events have the greatest operational impact for a given type of vehicle, which can be used to determine which issues to address in in-service vehicles of the given type and which can further be used to improve the designs of new vehicles (e.g., by modifying the design to prevent occurrences of service events within the problem category).

Figure 7:
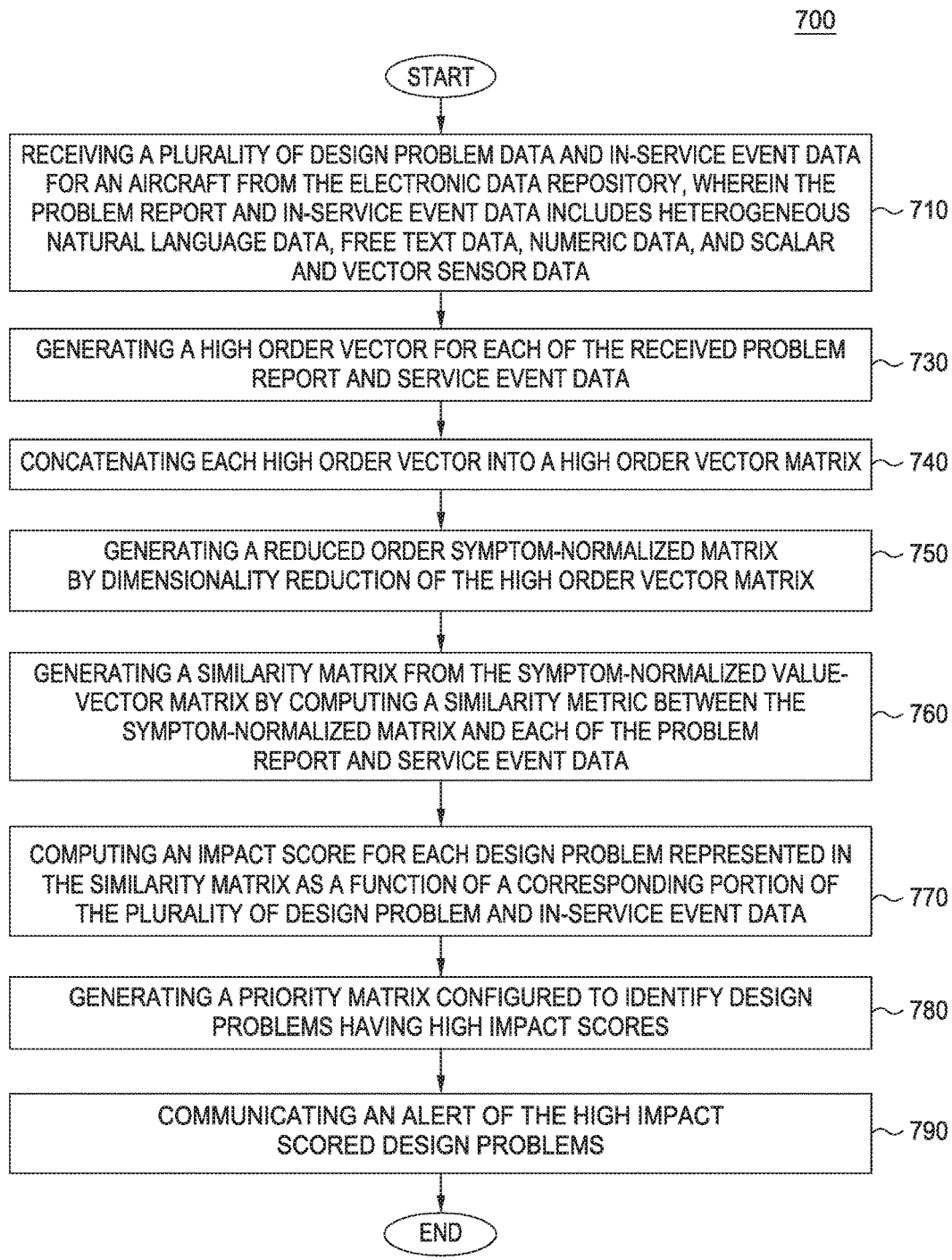
FIG. 7 is a block diagram illustrating a method of determining an operational impact of service events, according to one embodiment described herein.

FIG. 7 is a block diagram illustrating a method of determining an operational impact of service events, according to one embodiment described herein. As shown, the method 700 begins at block 710, where the vehicular problem impact component 120 receives a plurality of design problem data and in-service event data for an aircraft from an electronic data repository. In one embodiment, the problem report and in-service event data include heterogeneous natural language data, free text data, numeric data and scalar and vector sensor data.

The vehicular problem impact component 120 then generates a high order vector for each of the received problem reports and in-service event data (block 730) and concatenates each high order vector into a high order vector matrix (block 740). The vehicular problem impact component 120 can perform an optimization operation(s) on the high order vector matrix in order to reduce the complexity of processing the matrix. In the method 700, the vehicular problem impact component 120 generates a reduced order symptom-normalized matrix by dimensionality reduction of the concatenated high order vector matrix (block 750). For example, the vehicular problem impact component 120 could perform a truncated singular value decomposition algorithm to reduce the high order vector matrix, keeping only the top k<<m singular values and vectors within the high order vector matrix.

The vehicular problem impact component 120 then generates a similarity matrix from the symptom-normalized matrix by computing a similarity metric between the symptom-normalized matrix and each of the problem report and in-service event data (block 760). For example, the vehicular problem impact component 120 could calculate the cosine distance between the values within the symptom-normalized matrix and each of the problem report and in-service event data, using the Equation 3 shown below.

Cosine Distance Similarity $$\text{Similarity} = \cos(\theta) = \frac{A \cdot B}{\|A\|\|B\|}$$

Equation 3

More generally, however, any algorithm for calculating an indication of similarity between the values within the symptom-normalized matrix. The vehicular problem impact component 120 further computes an impact score for each design problem represented in the similarity matrix as a function of a corresponding portion of the design problem and in-service event data (block 770). For example, the vehicular problem impact component 120 could calculate the operational impact of each design problem using the Equation 4 shown below, where I represents the operational impact score, D represents an amount of time a flight was delayed, R represents a cost of repairing the aircraft, F represents a binary value indicative of whether flight was cancelled as a result of the in-service event, P represents a binary value indicative of whether a penalty was assessed against the aircraft operator as a result of the in-service event, and C1, C2 and C3 are constant values.

$$I=C1*D+R+C2*F+C3*P$$

Equation 4: Operational Impact Quantification

While the Equation 4 provides one example of an operational impact estimation algorithm used to calculate the impact score for each design problem, more generally the vehicular problem impact component 120 can be configured to use any technique for quantifying the impact of a design problem can be used, consistent with the present disclosure. Once the impact scores are calculated, the vehicular problem impact component 120 generates a priority matrix configured to identify design problems having high impact scores (block 780). For example, the vehicular problem impact component 120 could sort the design problems based on the calculated impact scores. The vehicular problem impact component 120 then communicates an alert of the high impact design problems (block 790), and the method 700 ends.

Figure 8:
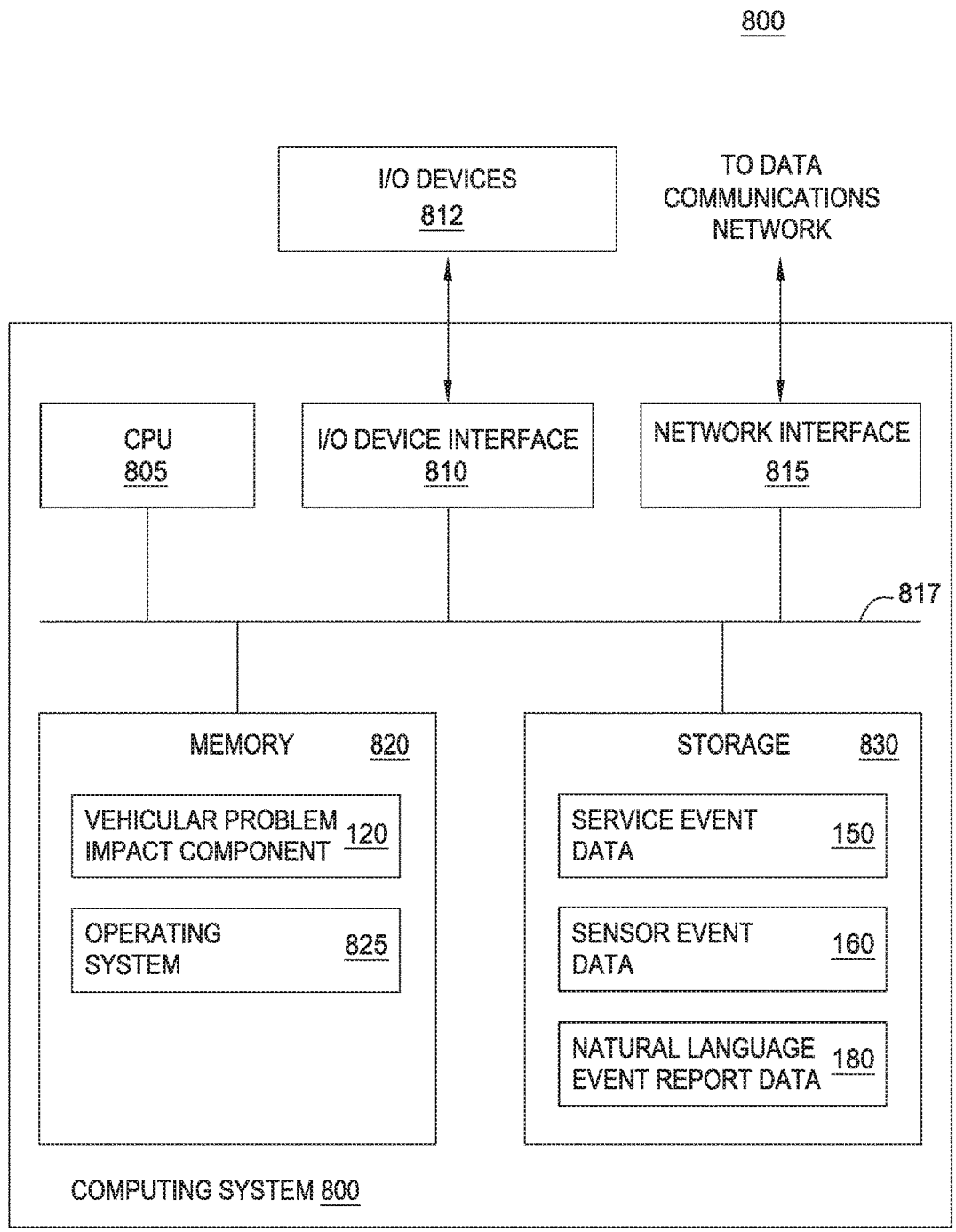
FIG. 8 is a block diagram illustrating a computing system configured with a vehicular problem impact component, according to one embodiment described herein.

FIG. 8 is a block diagram illustrating a computing system configured with a vehicular problem impact component, according to one embodiment described herein. As shown the computing system 800 includes, without limitation, a central processing unit (CPU) 805, a network interface 815, a memory 820, and storage 830, each connected to a bus 817. The computing system 800 may also include an I/O device interface 810 connecting I/O devices 812 (e.g., keyboard, mouse, and display devices) to the computing system 800. Further, in context of this disclosure, the computing elements shown in the computing system 800 may correspond to a physical computing system (e.g., a system in a data center) or may be a virtual computing instance executing within a computing cloud.

Generally, the CPU 805 retrieves and executes programming instructions stored in the memory 820 as well as stores and retrieves application data residing in the memory 820. The bus 817 is used to transmit programming instructions and application data between CPU 805, I/O devices interface 810, storage 830, network interface 815, and memory 820. Note, CPU 805 is included to be representative of a single CPU, multiple CPUs, a single CPU having multiple processing cores, and the like. Memory 820 is generally included to be representative of a random access memory. Storage 830 may be a disk drive storage device. Although shown as a single unit, storage 830 may be a combination of fixed and/or removable storage devices, such as fixed disc drives, removable memory cards, or optical storage, network attached storage (NAS), or a storage area-network (SAN).

Illustratively, the memory 820 includes a vehicular problem impact component 120 and an operating system 825. The storage 830 includes service event data 150, sensor event data 160 and natural language event report data 180. In one embodiment, the vehicular problem impact component 120 communicates with sensors on an aircraft(s) during flight operations and captures the service event data 150 and sensor event data 160. Additionally, the vehicular problem impact component 120 could communicate with a maintenance system to retrieve the natural language event report data 180. The vehicular problem impact component 120 can then generate a high order vector for each event within the service event data 150, the sensor event data 160 and the natural language event report data 180. Additionally, the vehicular problem impact component 120 could concatenate each generated high order vector into a high order vector matrix. The vehicular problem impact component 120 could further generate a reduced order symptom-normalized matrix by factorization of the concatenated high order vector matrix. The vehicular problem impact component 120 could also generate a similarity matrix from the symptom-normalized matrix and could compute an impact score for each event as a function of similar problem reports using the similarity matrix. The vehicular problem impact component 120 could generate a priority matrix configured to identify service event data having high impact scores and communicate a real-time alert of the high impact scored service event. Doing so enables engineers to identify which types of events have the greatest operational impact for the given type of vehicle, thereby enabling them to prioritize the avoidance of these events in future designs.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Embodiments of the invention may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present invention, a user may access applications (e.g., the vehicular problem impact component 120) or related data available in the cloud. For example, the vehicular problem impact component 120 could execute on a computing system in the cloud and could retrieving problem report data for at least a first class of vehicle, including problem reports each comprising a natural language description of a respective problem occurrence, a plurality of service events each specifying a fault code, and a plurality of sensor events each corresponding to a respective occurrence of a pattern of data being received from one or more sensor devices. The vehicular problem impact component 120 could calculate a vector representation for each event within the problem report data and could reduce a dimensionality of a matrix containing the calculated vector representations. The vehicular problem impact component 120 could further calculate similarity values between the reduced vector representations and could categorizing each of the reduced vector representations into one of a plurality of problem categories, based on the calculated similarities. The vehicular problem impact component 120 could then determine a respective impact for each of the plurality of problem categories. Doing so allows a user to access this impact information from any computing system attached to a network connected to the cloud (e.g., the Internet).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. An unsupervised machine learning aircraft design method, comprising:
   receiving, by operation of at least one processor coupled to an electronic data repository and a communication network, a plurality of design problem data and in-service event data for an aircraft from the electronic data repository, wherein the plurality of design problem data and in-service event data includes heterogeneous natural language data, free text data, numeric data, and scalar and vector sensor data;
   generating a high order vector for each of the plurality of design problem data and in-service event data, wherein a first high order vector is generated for a first design problem data and in-service event data of the plurality of design problem data and in-service event data, based on natural language text contained within the first design problem data and in-service event data;

concatenating each high order vector, including the first high order vector, into a high order vector matrix;
generating a reduced order symptom-normalized matrix by dimensionality reduction of the high order vector matrix;
generating a similarity matrix from the reduced order symptom-normalized matrix by computing a similarity metric between the reduced order symptom-normalized matrix and each of the plurality of problem data and in-service event data;
computing an impact score for each design problem represented in the similarity matrix as a function of a corresponding portion of the plurality of design problem data and in-service event data;
generating a priority matrix configured to identify design problems having high impact scores;
communicating an alert of the high impact scored design problems; and
prioritizing corresponding maintenance schedule and design updates for at least one aircraft during development, based on the generated similarity matrix.

2. The method of claim 1, wherein the plurality of design problem data and in-service event data includes one or more of in-service event fault codes and sensor data.

3. The method of claim 1, wherein computing the impact score for each design problem is based on analyzing a database of event reports comprising maintenance or other operational consequences including historical dispatch delays, maintenance time and maintenance cost associated with a plurality of historical in in-service problem reports on vehicles, to determine a respective cost value.

4. The method of claim 3, further comprising:
prioritizing a plurality of design updates on at least one aircraft during development, based on the generated similarity matrix, in order to minimize an overall severity of the maintenance or other operational consequences for a delivered vehicle.

5. The method of claim 1, wherein receiving the plurality of design problem data and in-service event data for the aircraft from the electronic data repository further comprises:
data mining a database comprising a plurality of lab tests problem reports, a plurality of vehicle test problem reports, a plurality of vehicle system health management fault reports, and a plurality of vehicle sensor inputs.

6. The method of claim 1, further comprising:
providing a plurality of predefined trigger conditions, each specifying conditional logic for one or more types of sensor data collected from the sensors on the aircraft; and
upon determining that one or more sensor data values from the sensors on the aircraft satisfy one of plurality of predefined trigger conditions, recording a sensor event in the plurality of design problem data and in-service event data.

7. The method of claim 1, wherein in- service events in the in-service event data are automatically recorded by control logic within the aircraft.

8. The method of claim 1, wherein generating the high order vector for each of the plurality of design problem data and in-service event data, further comprises:
performing a vector space analysis of the plurality of design problem data and in-service event data, such that a respective vectorial representation is calculated based on the heterogeneous natural language data, free text data, numeric data, and scalar and vector sensor data.

9. The method of claim 8, wherein generating the reduced order symptom-normalized matrix by dimensionality reduction of the high order vector matrix further comprises:
performing a truncated singular value decomposition factorization of the high order vector matrix, wherein the reduced order symptom-normalized matrix approximates the high order vector matrix.

10. The method of claim 9, wherein computing the similarity metric between the reduced order symptom-normalized matrix and each of the plurality of design problem data and in-service event data further comprises:
calculating a measure of similarity between each vectorial representation within the reduced order symptom-normalized matrix.

11. The method of claim 10, further comprising:
performing a clustering algorithm on a plurality of vectors within the reduced order symptom-normalized matrix.

12. The method of claim 1, wherein computing the impact score for each design problem is further based on an operational impact estimation algorithm.

13. The method of claim 12, wherein the operational impact estimation algorithm includes a measure of delay time, a measure of repair cost, and a measure of whether a flight was cancelled.

14. A system, comprising:
one or more computer processors; and
a memory containing computer program code that, when executed by operation of the one or more computer processors, performs an operation comprising:
retrieving problem report data for at least a first class of vehicle, comprising:
retrieving a plurality of user-submitted problem reports, each comprising a natural language description of a respective problem occurrence for a respective in-service vehicle of the first class of vehicle;
retrieving a plurality of service events, each specifying a fault code; and
retrieving a plurality of sensor events, each corresponding to a respective occurrence of a pattern of data being received from one or more sensor devices;
calculating a vector representation for each of the plurality of user-submitted problem reports, the plurality of service events and the plurality of sensor events, wherein a first vector representation is generated for a first user-submitted problem report containing natural language text describing the respective problem occurrence for the respective in-service vehicle of the first class of vehicle;
reducing a dimensionality of the vector representations;
calculating similarity values between the vector representations;
categorizing each of the vector representations into one of a plurality of problem categories, based on the similarity values;
calculating a respective measure of impact for each of the plurality of problem categories; and
prioritizing corresponding maintenance schedule and design updates for at least one aircraft during development, based on the calculated measures of impact.

15. The system of claim 14, the operation further comprising:

providing a plurality of predefined trigger conditions, each specifying conditional logic for one or more types of sensor data received from the one or more sensor devices; and upon determining that one or more sensor data values from the one or more sensor devices satisfy one of plurality of predefined trigger conditions, recording one of the plurality of sensor events.

16. The system of claim 14, wherein calculating the vector representation for each of the plurality of user-submitted problem reports, the plurality of service events and the plurality of sensor events, comprises:

performing a vectorial analysis of the problem report data, such that a respective vectorial representation is calculated for each of a plurality of problem reports of the problem report data, based on a corresponding portion of the plurality of user-submitted problem reports, the plurality of service events and the plurality of sensor events; and generating a matrix that includes all of the vectorial representations for the plurality of user-submitted problem reports, the plurality of service events and the plurality of sensor events.

17. The system of claim 16, wherein reducing the dimensionality of the vectorial representations further comprises:

performing a truncated singular value decomposition factorization of the matrix, to generate a reduced matrix, wherein reduced matrix approximates the matrix.

18. The system of claim 17, wherein calculating the similarity values between the vector representations further comprises calculating a respective similarity metric between each vectorial representation within the reduced matrix and each other vectorial representation within the reduced matrix, and wherein categorizing each of the vector representations within the reduced matrix into one of a plurality of problem categories further comprises performing a clustering algorithm on each of a plurality of vectorial representations within the reduced matrix.

19. A non-transitory computer-readable medium containing computer program code that, when executed by operation of one or more computer processors, performs an operation comprising:

retrieving problem report data for at least a first class of vehicle, comprising:

retrieving a plurality of user-submitted problem reports, each comprising a natural language description of a respective problem occurrence for a respective in-service vehicle of the first class of vehicle;

retrieving a plurality of service events, each specifying a fault code; and retrieving a plurality of sensor events, each corresponding to a respective occurrence of a pattern of data being received from one or more sensor devices;

calculating a vector representation for each of the plurality of user-submitted problem reports, the plurality of service events and the plurality of sensor events, wherein a first vector representation is generated for a first user-submitted problem report containing natural language text describing the respective problem occurrence for the respective in-service vehicle of the first class of vehicle;

reducing a dimensionality of the vector representations;

calculating similarity values between the vector representations;

categorizing each of the vector representations into one of a plurality of problem categories, based on the similarity values;

calculating a respective measure of impact for each of the plurality of problem categories; and prioritizing corresponding maintenance schedule and design updates for at least one aircraft during development, based on the calculated measures of impact.

* * * * *